United States Patent
Abe et al.

(10) Patent No.: US 8,319,345 B2
(45) Date of Patent: Nov. 27, 2012

(54) SEMICONDUCTOR PACKAGING SUBSTRATE AND SEMICONDUCTOR DEVICE

(75) Inventors: Tatsunobu Abe, Ome (JP); Seiji Miyamoto, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 150 days.

(21) Appl. No.: 12/838,447

(22) Filed: Jul. 17, 2010

(65) Prior Publication Data

US 2011/0062593 A1 Mar. 17, 2011

(30) Foreign Application Priority Data

Sep. 11, 2009 (JP) ................... 2009-209958

(51) Int. Cl.
*H01L 23/48* (2006.01)
*H01L 23/52* (2006.01)

(52) U.S. Cl. .......... 257/773; 257/774; 257/730; 438/26; 438/612

(58) Field of Classification Search .............. 438/26, 438/618; 257/730, 773, 774
See application file for complete search history.

(56) References Cited

U.S. PATENT DOCUMENTS

| 5,372,872 | A * | 12/1994 | Funada et al. ............... 428/210 |
| 5,639,989 | A * | 6/1997 | Higgins, III ................. 174/386 |
| 6,307,259 | B1 * | 10/2001 | Asada et al. .................. 257/691 |
| 6,930,240 | B1 * | 8/2005 | Giboney et al. .............. 174/393 |
| 7,291,790 | B2 * | 11/2007 | Bachar et al. ................ 174/262 |
| 7,897,880 | B1 * | 3/2011 | Goergen et al. .............. 174/262 |
| 2006/0043572 | A1 * | 3/2006 | Sugimoto et al. ............ 257/700 |

FOREIGN PATENT DOCUMENTS

| JP | 61-005549 A | 1/1986 |
| JP | 05-206678 A | 8/1993 |
| JP | 2000-349192 A | 12/2000 |

* cited by examiner

*Primary Examiner* — Jarrett Stark
*Assistant Examiner* — Nicholas Tobergte
(74) *Attorney, Agent, or Firm* — Miles & Stockbridge P.C.

(57) ABSTRACT

A semiconductor packaging substrate with a plurality of pads arranged in a square grid pattern thereon, in which among the pads, two pads obliquely adjacent to each other are connected with through-holes respectively and another through-hole is provided between the through-holes connected with the two pads obliquely adjacent to each other.

8 Claims, 5 Drawing Sheets

SEMICONDUCTOR PACKAGING SUBSTRATE AND SEMICONDUCTOR DEVICE

The present application claims priority from Japanese patent application JP 2009-209958 filed on Sep. 11, 2009, the content of which is hereby incorporated by reference into this application.

FIELD OF THE INVENTION

The present invention relates to semiconductor packaging substrates and semiconductor devices, and more particularly to pads and through-holes of semiconductor packaging substrates.

BACKGROUND OF THE INVENTION

For connection between two semiconductor integrated circuits which make long-distance data transmissions between them, the arrays of pads on their respective semiconductor packaging substrates are interconnected through wires on a backplane board. The pads are connected with the semiconductor integrated circuits via through-holes (hereinafter abbreviated as "TH"). Since a signal sent from pads of the semiconductor packaging substrate connected with one of the semiconductor integrated circuits attenuates before it reaches pads of the semiconductor packaging substrate connected with the other semiconductor integrated circuit, it is necessary to suppress crosstalk with a signal sent from pads of the packaging substrate connected with the other semiconductor integrated circuit. In such transmissions, the magnitude of a signal received by each semiconductor integrated circuit is at least 20 dB smaller than when it is transmitted, so it is necessary to reduce crosstalk from a transmitted signal to −60 dB or less.

Techniques of reducing crosstalk that ground (hereinafter abbreviated as GND) voltage pads are disposed around pads connected with signal lines (hereinafter referred to as signal pads) are known (JP-A-2000-349192 and JP-A-Sho61 (1986)-005549). Also JP-A-Hei5 (1993)-206678 proposes a technique that five or more grounded through-holes (hereinafter abbreviated as GND TH) are disposed around a through-hole connected with each of the signal pads of a semiconductor packaging substrate (hereinafter referred to as signal TH) in order to reduce crosstalk and control characteristic impedance.

SUMMARY OF THE INVENTION

In the conventional techniques that GND voltage pads are disposed around a signal pad, the ratio of the number of signal pads to the total number of pads is low and in order to get a certain number of signals, a larger number of pads must be provided, resulting in a larger package size.

Also, the techniques that GND THs are provided around a signal TH have the problem that the processing cost is increased. These techniques also impose restrictions on pad pitch reduction, raising the problem that the package size must be increased. For example, if the pad pitch is 1 mm or less for a build-up substrate, a kind of multilayer wiring substrate, which is a semiconductor packaging substrate, it is difficult that five GND THs are provided around a signal TH.

An object of the present invention is to provide a semiconductor packaging substrate and a semiconductor device which reduce crosstalk while keeping a high signal pad density for long-distance transmissions between semiconductor integrated circuits.

According to an aspect of the present invention, the above problem is solved as follows: in a semiconductor packaging substrate with pads arranged in a square grid pattern, among the pads arranged in a square grid pattern, two pads obliquely adjacent to each other are connected with through-holes respectively and another through-hole is provided between the through-holes connected with the two pads obliquely adjacent to each other. This reduces crosstalk in transmission and reception of signals through signal pads in a semiconductor integrated circuit connected with a semiconductor packaging substrate.

According to an aspect of the invention, crosstalk between signals can be reduced while the density of signal pads is kept high.

DETAILED DESCRIPTION OF THE PREFERRED EMBODIMENTS

First Embodiment

Figure 1:
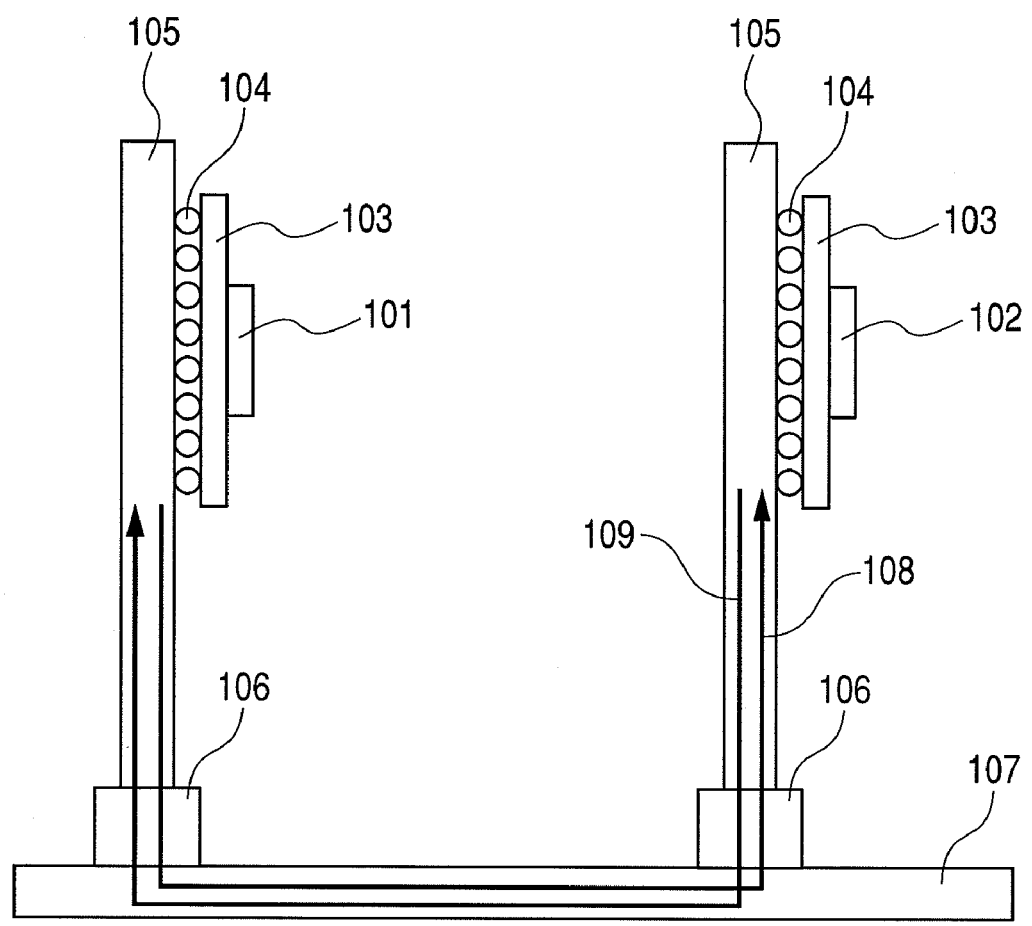
FIG. 1 is a sectional view schematically showing a system for long-distance transmissions through a backplane board between semiconductor integrated circuits.

FIG. 1 shows a semiconductor device according to a first embodiment of the invention. Semiconductor integrated circuits 101 and 102 which communicate with each other are connected to printed circuit boards 105 by BGA balls 104 of multilayer wiring substrates 103 as semiconductor packaging substrates and the printed circuit boards 105 are connected with each other through connectors 106 and a backplane board 107 which constitute a connecting section. At least one signal line for transmitting a signal from the semiconductor integrated circuit 101 to the semiconductor integrated circuit 102 and at least one signal line for transmitting a signal from the semiconductor integrated circuit 102 to the semiconductor integrated circuit 101 are provided between the BGA balls 104 of the semiconductor packaging substrate for the semiconductor integrated circuit 101 and the BGA balls 104 of the semiconductor packaging substrate for the semiconductor integrated circuit 102. The semiconductor integrated circuits communicate with each other as follows: a signal 108 is sent from the semiconductor integrated circuit 101 to the semiconductor integrated circuit 102 through the signal line for transmitting a signal from the semiconductor integrated circuit 101 to the semiconductor integrated circuit 102 and a signal 109 is sent from the semiconductor integrated circuit 102 to the semiconductor integrated circuit 101 through the signal line for transmitting a signal from the semiconductor integrated circuit 102 to the semiconductor integrated circuit 101. When the semiconductor integrated circuit 101 receives the signal 109, there occurs attenuation of the signal amplitude due to long-distance transmission through the connectors 106 and backplane board 107, which constitute the connecting section. If crosstalk occurs between the signal 108 and the attenuated signal 109, it would be difficult for the semiconductor integrated circuit 101 to receive a normal signal. Therefore, such crosstalk between signals must be suppressed.

Figure 2:
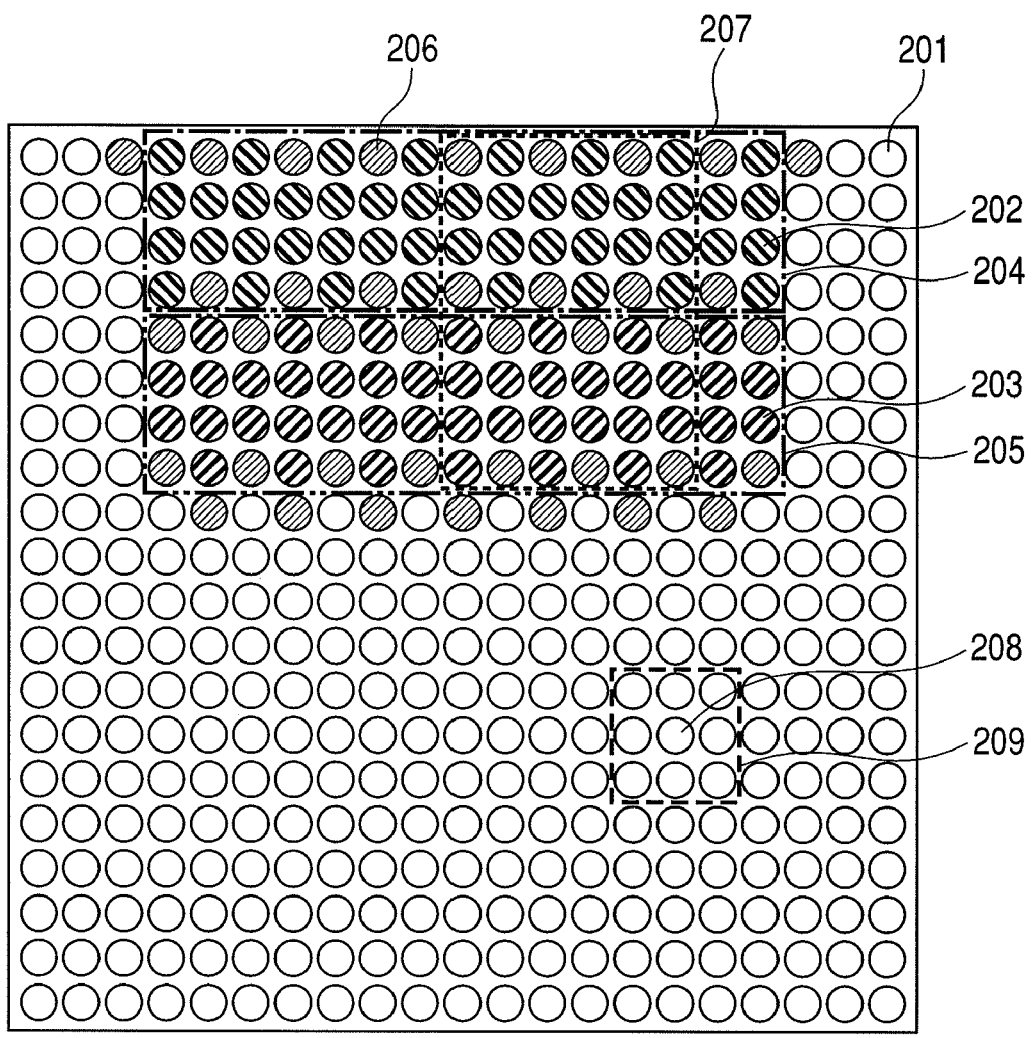
FIG. 2 is a plan view schematically showing an arrangement of pads according to an embodiment of the present invention.

FIG. 2 schematically shows the arrangement of pads 201 which hold the BGA balls 104 of the multilayer wiring substrate 103 connected with the semiconductor integrated circuit 101. The multilayer wiring substrate 103 connected with the semiconductor integrated circuit 102 is the same as the one connected with the semiconductor integrated circuit 101, so description thereof is omitted. As illustrated in FIG. 2, the pads 201 holding BGA balls 104 are arranged in a square grid pattern on the multilayer wiring substrate 103. In this embodiment, signal pads 202 for transmission of signals from the semiconductor integrated circuit 101 and signal pads 203 for reception of signals from the semiconductor integrated circuit 102 are respectively divided into two groups: group 204 encircled by dashed dotted line and group 205 encircled by dashed two-dotted line. Since the signal pads are divided into two groups 204 and 205 in this way, crosstalk can be prevented between an incoming signal which has attenuated during transmission and an outgoing signal whose amplitude is larger than that of the incoming signal. The group 204 of transmission signal pads 202 and the group 205 of reception signal pads 203 are disposed adjacently to each other and in each boundary zone between them, pads 206 connected with a constant voltage power supply or GND are arranged in a zigzag manner. The pads 206 which are connected with the constant-voltage power supply have a constant voltage. Therefore, since the pads 206 are connected with the constant-voltage power supply or GND, they have a constant voltage or are grounded.

For a signal line, a small-loop return path is required in order to reduce noise. The zigzag arrangement of the pads 206 connected with the constant-voltage power supply or GND allows for a signal return path with a small loop for the signal lines connected with signal pads 202 adjacent to a pad 206 and signal pads 203 adjacent to a pad 206 respectively. Here, adjacent pads mean eight pads 201 which surround one pad 201. For example, in FIG. 2, pads adjacent to a pad 208 are the eight pads which surround the pad 208 and lie in the area encircled by dotted line 209. In other words, the adjacent pads are four pads which are closest to the pad 208 in the square grid arrangement and four pads which are next closest and obliquely adjacent to it. Furthermore, pads 206 connected with the constant-voltage power supply or GND are arranged in a zigzag manner on the respective peripheries of the group 204 and group 205 and two rows of signal pads 202 (signal pads 203) are provided between the rows of zigzag-arranged pads so that every pad 202 in the group 204 (every pad 203 in the group 205) has at least one pad 206 adjacent to it. In this arrangement, the ratio of the sum of the number of transmission signal pads 202 and the number of reception signal pads 203 to the number of pads 206 connected with the constant-voltage power supply or GND is 3:1, which means that a relatively large number of signal pads are provided.

Figure 3:
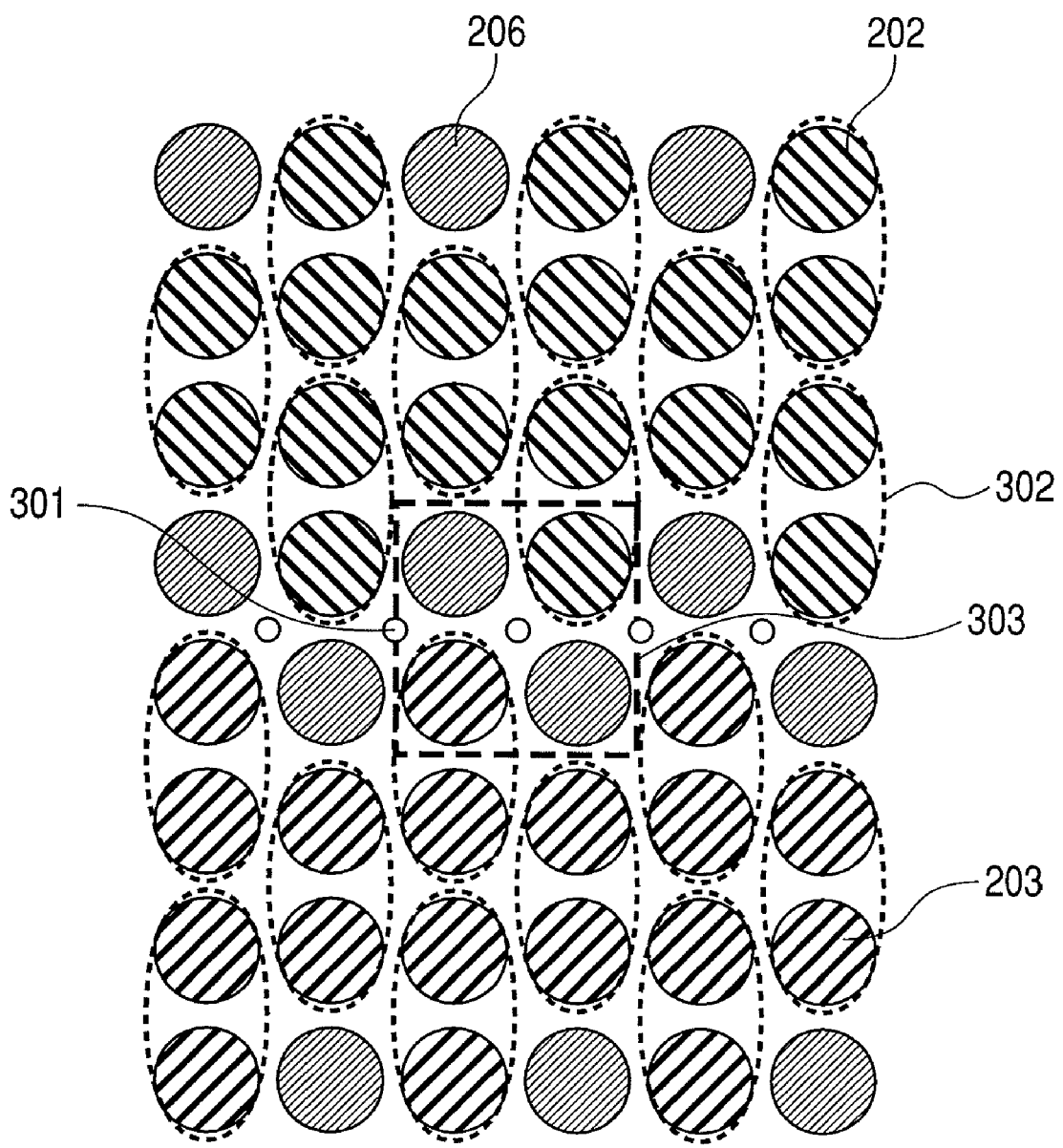
FIG. 3 is an enlarged view of the area encircled by dotted line in FIG. 2.

FIG. 3 is an enlarged view of the area 207 encircled by dotted line in FIG. 2. In the semiconductor packaging substrate 103 according to this embodiment, through-holes 301 (hereinafter referred to as shield THs 301) connected with the constant-voltage power supply or GND are provided in the boundary zone between the groups 204 and 205. The shield THs 301 connected with the constant-voltage power supply have a constant voltage. Since the shield THs 301 are connected with the constant-voltage power supply or GND, they have a constant voltage or are grounded. The shield THs 301 prevent crosstalk between signals transmitted through transmission signal pads 202 and signals received through reception signal pads 203. For differential signaling, pad pairs 302 (encircled by dotted line in FIG. 3) are assigned as differential pairs.

Figure 4:
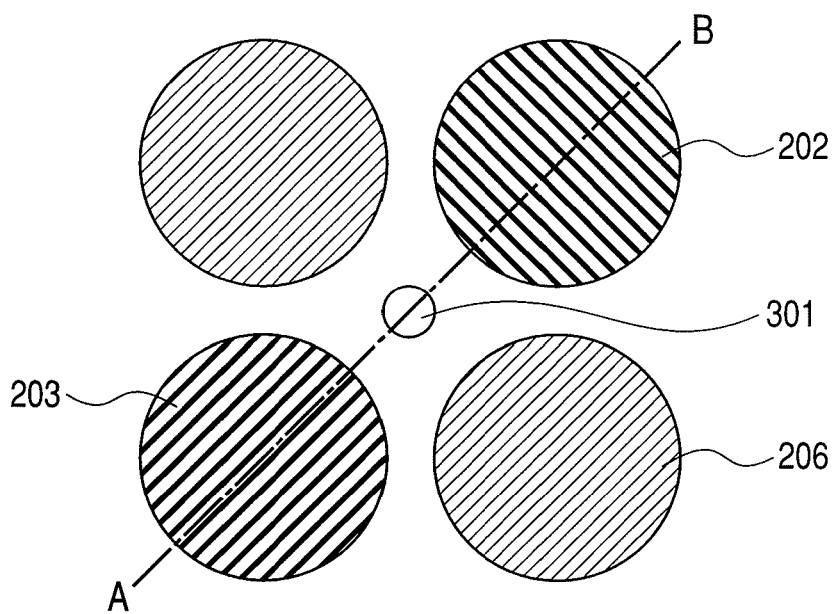
FIG. 4 is an enlarged view of the area encircled by dotted line in FIG. 3.

FIG. 4 is an enlarged view of the area 303 encircled by dotted line in FIG. 3. As shown in FIG. 4, in the boundary zone between the groups 204 and 205 there are two pads 206 connected with the constant-voltage power supply or GND which are adjacent to each other obliquely in the square grid arrangement and a shield TH 301 located between the two pads 206. In addition, as shown in FIG. 4, there are a transmission signal pad 202 connected with a signal line for transmitting a signal from the semiconductor integrated circuit 101 and a reception signal pad 203 for receiving a signal from the semiconductor integrated circuit 102 with the shield TH 301 between them. As for the positional relationship among the pads, the two pads 206 connected with the constant-voltage power supply or GND lie adjacent to both the transmission signal pad 202 and the reception signal pad 203. In other words, the transmission signal pad 202 and the reception signal pad 203 are adjacent to both the two pads 206 connected with the constant-voltage power supply or GND.

Figure 5:
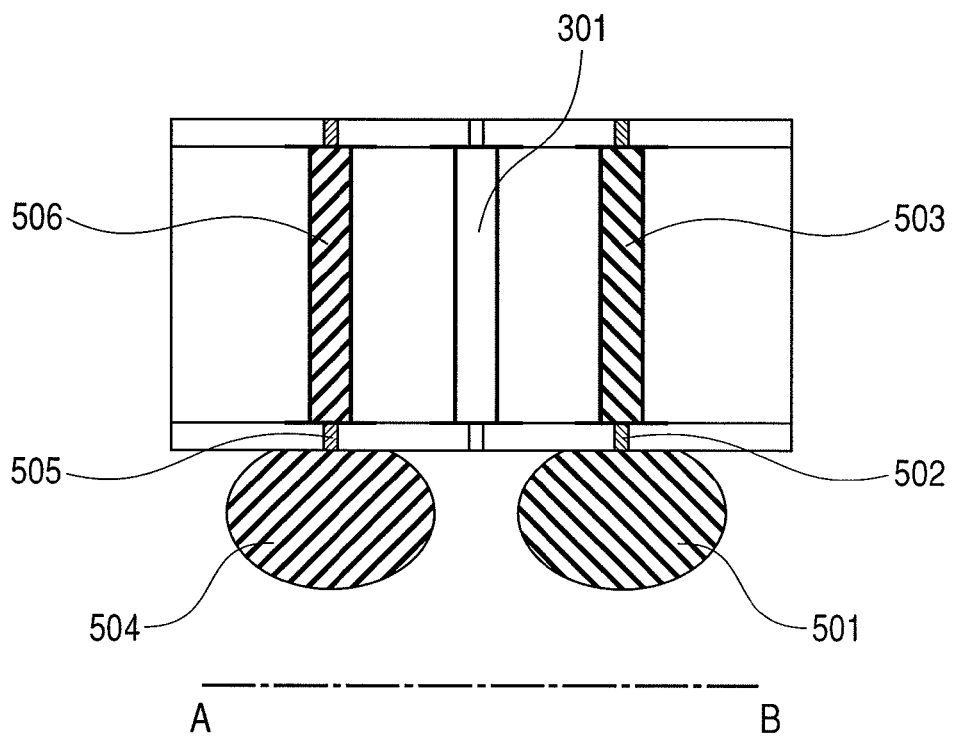
FIG. 5 is a sectional view taken along the line A-B in FIG. 4.

FIG. 5 is a sectional view of the semiconductor packaging substrate 103, taken along the line A-B in FIG. 4. The semiconductor packaging substrate 103 is a multilayer wiring substrate. For simple illustration, a cross section of only one layer including BGA balls and through-holes connected through vias is shown in FIG. 5. A BGA ball 501 which constitutes a transmission signal pad 202 is connected through a via 502 to a transmission through-hole 503 (hereinafter referred to as transmission TH 503). The transmission TH 503 is connected with a signal output of the semiconductor integrated circuit 101. A BGA ball 504 which constitutes a reception signal pad 203 is connected through a via 505 to a reception through-hole 506 (hereinafter referred to as reception TH 506). The reception TH 506 is connected with a signal input of the semiconductor integrated circuit 101. A shield TH 301 is provided between the transmission TH 503 and the reception TH 506 which are adjacent to each other. The pads 206 connected with the constant-voltage power supply or GND are also connected with through-holes through vias. Therefore, a shield TH 301 is also provided between the THs connected with the two pads 206.

Figure 6:
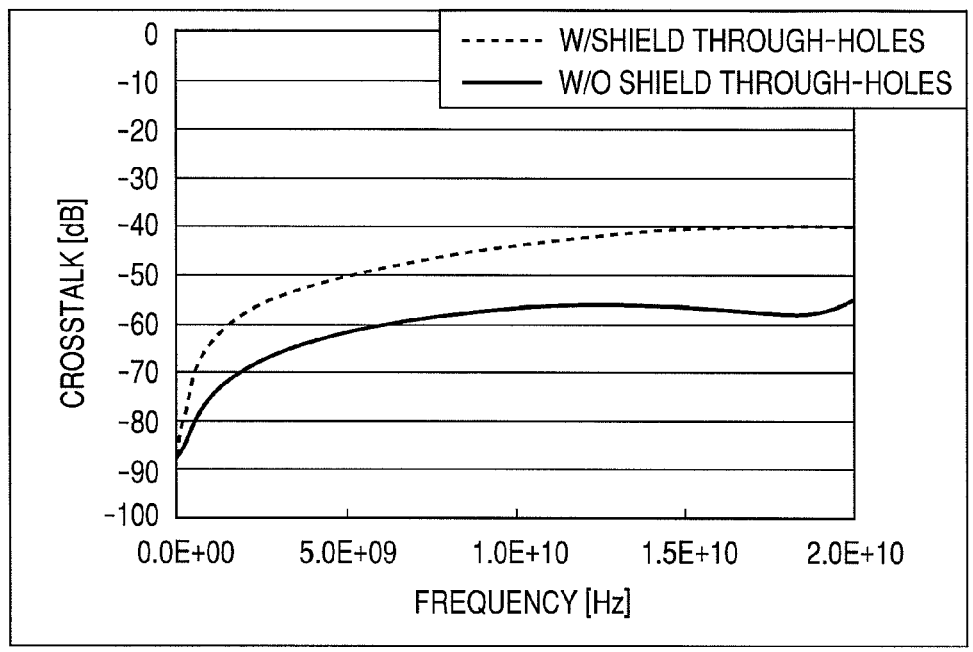
FIG. 6 shows the result of simulation of crosstalk between differential signals with and without shield through-holes.

FIG. 6 shows the result of simulation by electromagnetic analysis of crosstalk between differential signals transmitted and received through the signal pad 202 and signal pad 203 which are adjacent to both the two pads 206 connected with the constant-voltage power supply or GND shown in FIG. 4. In the calculation of crosstalk between differential signals, a signal pad 202 paired with the signal pad 202 shown in FIG. 4 to make up a differential pair and a signal pad 203 paired with the signal pad 203 shown in FIG. 4 to make up a differential pair are added to the pads and shield TH 301 shown in FIG. 4. The positional relationship among differential pairs is as shown in FIG. 3. In FIG. 6, the vertical axis represents the magnitude of crosstalk between neighboring different signals in dB and the horizontal axis represents the frequency of differential signals. Comparison of crosstalk with a shield TH 301 (expressed by the curve indicated by solid line) and crosstalk without a shield TH 301 (expressed by the curve indicated by dotted line) reveals that the magnitude of crosstalk with the shield TH 301 is at least 10 dB lower than the magnitude of crosstalk without it. The graph also indicates that in the frequency range up to 5 GHz or so, the magnitude of crosstalk is not more than −60 dB. This electromagnetic analysis was conducted under the following conditions: pad pitch 1 mm and TH length 800 μm. Therefore, high speed transmissions can be made with minimized crosstalk while the density of signal lines is kept high.

In the simulation shown in FIG. 6, it is a shield TH 301 and two constant-voltage or grounded pads 206 with the shield TH 301 between them and through-holes connected with the two pads 206 respectively that block crosstalk between outgoing and incoming signals. Therefore, according to this embodiment, the semiconductor packaging substrate should have a plurality of pads arranged in a square grid pattern in which two pads obliquely adjacent to each other are connected with through-holes respectively and another through-hole is provided between the through-holes connected with the two pads obliquely adjacent to each other.

Figure 7:
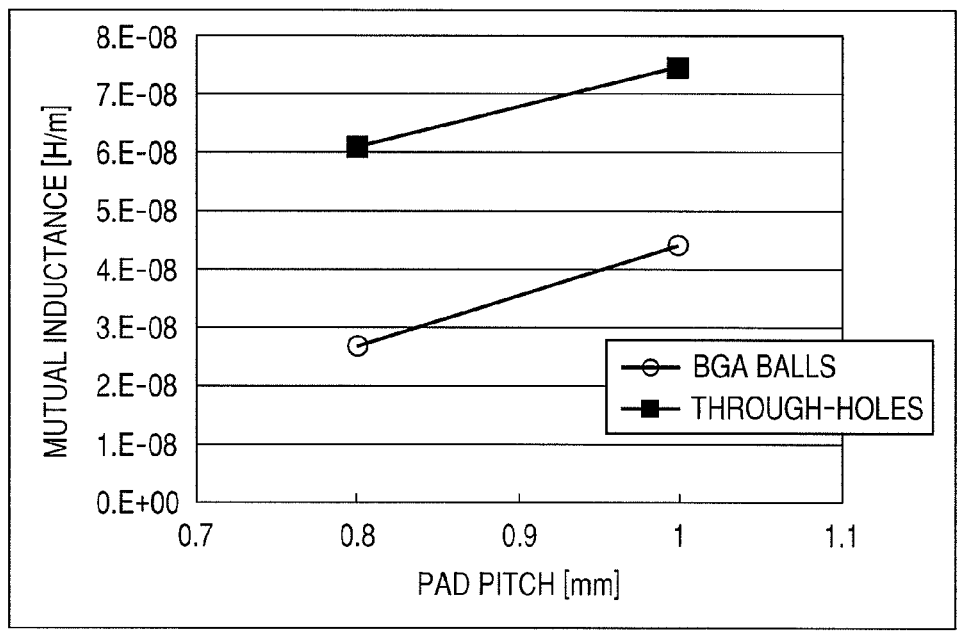
FIG. 7 shows the result of simulation of mutual inductance between BGA balls and mutual inductance between THs depending on pad pitch.

FIG. 7 demonstrates that reduction of crosstalk according to the present invention is possible even when the pad pitch is small. FIG. 7 shows the result of simulation of mutual inductance between BGA balls and mutual inductance between through-holes which can cause crosstalk. The larger the value of mutual inductance is, the more significant crosstalk is. The vertical axis represents mutual inductance and the horizontal axis represents pad pitch. From FIG. 7, it is known that as the pad pitch decreases from 1 mm to 0.8 mm, mutual inductance between BGA balls and mutual inductance between through-holes become smaller, namely crosstalk decreases. Also mutual inductance can be decreased by shortening the through-hole length. Therefore, the present invention can be applied not only to resin multilayer wiring substrates but also to thin ceramic substrates with a smaller pad pitch.

What is claimed is:

1. A semiconductor device comprising:
   a semiconductor integrated circuit; and
   a semiconductor packaging substrate connected with the semiconductor integrated circuit,
   the semiconductor packaging substrate including:
   a plurality of pads arranged in a square grid pattern;
   among the plural pads, a first pad which outputs a signal from the semiconductor integrated circuit;
   among the plural pads, a second pad disposed adjacent to the first pad obliquely in the square grid arrangement, which inputs a signal to the semiconductor integrated circuit;
   among the plural pads, a third pad and a fourth pad which are adjacent to both the first pad and the second pad and are grounded or have a constant voltage;
   a first through-hole connected with the first pad;
   a second through-hole connected with the second pad;
   a third through-hole connected with the third pad;
   a fourth through-hole connected with the fourth pad; and
   a fifth through-hole which is provided between the first through-hole and the second through-hole and grounded or has a constant voltage.

2. The semiconductor device according to claim 1, wherein grounded or constant-voltage pads connected with through-holes, including the third pad and the fourth pad, are arranged in a zigzag manner.

3. The semiconductor device according to claim 2, wherein with the zigzag arrangement of pads as a boundary, among the plural pads are a group of pads, including the first pad, which output a signal from the semiconductor integrated circuit and among the plural pads are a group of pads, including the second pad, which input a signal to the semiconductor integrated circuit.

4. The semiconductor device according to claim 3, wherein, spaced from the zigzag arrangement of pads by two rows of pads, another zigzag arrangement of grounded or constant-voltage pads is provided.

5. A semiconductor device comprising:
   a first semiconductor integrated circuit;
   a second semiconductor integrated circuit;
   a first semiconductor packaging substrate connected with the first semiconductor integrated circuit;
   a second semiconductor packaging substrate connected with the second semiconductor integrated circuit; and
   a connecting section which connects the first semiconductor integrated circuit and the second semiconductor integrated circuit by at least one first signal line for transmitting a signal from the first semiconductor integrated circuit and at least one second signal line for transmitting a signal from the second semiconductor integrated circuit,
   the first semiconductor packaging substrate including:
   a plurality of pads arranged in a square grid pattern;
   among the plural pads, a first pad connected with one of the first signal lines;
   among the plural pads, a second pad disposed adjacent to the first pad obliquely in the square grid arrangement and connected with one of the second signal lines;
   among the plural pads, a third pad and a fourth pad which are adjacent to both the first pad and the second pad and are grounded or have a constant voltage;
   a first through-hole connected with the first pad;
   a second through-hole connected with the second pad;
   a third through-hole connected with the third pad;
   a fourth through-hole connected with the fourth pad; and
   a fifth through-hole which is provided between the first through-hole and the second through-hole and grounded or has a constant voltage.

6. The semiconductor device according to claim 5, wherein grounded or constant-voltage pads connected with through-holes, including the third pad and the fourth pad, are arranged in a zigzag manner.

7. The semiconductor device according to claim 6, wherein among the plural pads are a group of pads connected with the first signal lines and a group of pads connected with the second signal lines with the zigzag arrangement of pads as a boundary.

8. The semiconductor device according to claim 7, wherein, spaced from the zigzag arrangement of pads by two rows of pads, another zigzag arrangement of grounded or constant-voltage pads is provided.

* * * * *